(12) United States Patent
Hayashi et al.

(10) Patent No.: US 7,245,797 B2
(45) Date of Patent: Jul. 17, 2007

(54) ELECTRO-OPTICAL DEVICE, MANUFACTURING METHOD OF THE SAME, AND ELECTRONIC APPARATUS

(75) Inventors: Kenji Hayashi, Suwa (JP); Ryoichi Nozawa, Tatsuno-machi (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 11/599,278

(22) Filed: Nov. 15, 2006

(65) Prior Publication Data
US 2007/0065072 A1 Mar. 22, 2007

Related U.S. Application Data

(63) Continuation of application No. 10/927,077, filed on Aug. 27, 2004, now Pat. No. 7,158,694.

(30) Foreign Application Priority Data

| Sep. 4, 2003 | (JP) | ............................. 2003-312760 |
| Sep. 4, 2003 | (JP) | ............................. 2003-312761 |
| Sep. 4, 2003 | (JP) | ............................. 2003-312763 |
| Jun. 30, 2004 | (JP) | ............................. 2004-193505 |

(51) Int. Cl.
*G02B 6/12* (2006.01)
*H01L 21/00* (2006.01)
*H01J 1/62* (2006.01)

(52) U.S. Cl. .................... 385/14; 385/901; 438/26; 438/29; 438/30; 438/31; 313/504; 313/306

(58) Field of Classification Search ................. 385/14, 385/129, 130, 131, 88, 89, 49, 901; 313/504, 313/306; 438/26, 27, 28, 29, 30, 31
See application file for complete search history.

(56) References Cited

U.S. PATENT DOCUMENTS

| 5,952,778 | A | 9/1999 | Haskal et al. ............... 313/504 |
| 6,268,695 | B1 | 7/2001 | Affinito ..................... 313/504 |
| 6,429,584 | B2 | 8/2002 | Kubota ....................... 313/504 |
| 6,590,337 | B1 | 7/2003 | Nishikawa et al. .......... 313/504 |
| 6,660,409 | B1 | 12/2003 | Komatsu et al. ............ 428/690 |
| 6,866,555 | B2 | 3/2005 | Tsutsui et al. .............. 445/24 |
| 6,958,796 | B2 | 10/2005 | Takizawa .................... 349/114 |

(Continued)

FOREIGN PATENT DOCUMENTS

| JP | B2-2776040 | 5/1998 | ............... 385/14 X |
| JP | A-2001-284041 | 10/2001 | ............... 385/14 X |

(Continued)

*Primary Examiner*—Brian M. Healy
(74) *Attorney, Agent, or Firm*—Oliff & Berridge, PLC

(57) ABSTRACT

To provide an electro-optical device in which the fluidity of a material for forming the underlying layer of a gas barrier layer is controlled, and the volume-change of the underlying layer is suppressed, so that stress-concentration on the gas barrier layer is relaxed, and to provide a method of producing the same and an electronic apparatus. In an electro-optical device having, on a substrate, a plurality of first electrodes, a bank structure having a plurality of openings positioned correspondingly to the formed first electrodes, electro-optical layers arranged in the respective openings, and a second electrode covering the bank structure and the electro-optical layers, the device includes a buffer layer formed so as to cover the second electrode and have a substantially flat upper surface, and a gas barrier layer covering the buffer layer.

8 Claims, 9 Drawing Sheets

U.S. PATENT DOCUMENTS

| | | | |
|---|---|---|---|
| 7,158,694 B2 * | 1/2007 | Hayashi et al. | 385/14 |
| 2003/0082859 A1 | 5/2003 | Ichijo et al. | 438/166 |
| 2003/0085654 A1 | 5/2003 | Hayashi | 313/506 |
| 2003/0151354 A1 | 8/2003 | Takizawa | 313/498 |
| 2004/0066137 A1 | 4/2004 | Hayashi | 313/506 |
| 2005/0112378 A1 * | 5/2005 | Naruse et al. | 428/412 |
| 2006/0023440 A1 | 2/2006 | Miyazawa | 361/792 |

FOREIGN PATENT DOCUMENTS

| | | | |
|---|---|---|---|
| JP | A-2003-142255 | 5/2003 | 385/14 X |
| JP | A-2004-095199 | 3/2004 | 385/14 X |
| JP | A-2004-127606 | 4/2004 | 385/14 X |
| JP | A-2004-127608 | 4/2004 | 385/14 X |
| KR | A-2002-0011104 | 2/2002 | 385/14 X |

* cited by examiner

ELECTRO-OPTICAL DEVICE, MANUFACTURING METHOD OF THE SAME, AND ELECTRONIC APPARATUS

This is a Continuation of application Ser. No. 10/927,077 filed Aug. 27, 2004 now U.S. Pat. No. 7,158,694. The disclosure of the prior application is hereby incorporated by reference herein in its entirety.

BACKGROUND OF THE INVENTION

1. Field of Invention

The present invention relates to an electro-optical device, a manufacturing method of the same, and an electronic apparatus equipped with the electro-optical device.

2. Description of Related Art

It has been one of the subjects in the field of electro-optical devices to enhance the durability of the devices against oxygen, water, and so forth. For example, in organic electroluminescence (hereinafter, abbreviated to organic EL) display devices, which are examples of the electro-optical devices, electro-optical materials (organic EL materials, hole-injection materials, electron-injection materials, or the like) for forming light-emitting layers (electro-optical layers) are deteriorated due to oxygen, water, or the like, and the conductivity of cathodes are reduced due to oxygen, water or the like, and thus, non-light-emitting regions called dark spots are formed. Therefore, problems occur in that the service life of the devices as a light-emitting device is decreased.

To solve the above-described problems, a method has been employed by which a lid made of glass or metal is fixed onto the substrate of a display device so that the substrate is sealed against oxygen, water, or the like. Recently, to cope with the increase in size, the light-weight, and the thickness reduction of display devices, a technique called thin-film sealing has been employed in which thin films made of silicon nitrides, silicon oxides, ceramics, or the like, which are transparent and have high gas barrier properties, are formed on light-emitting elements by high-density plasma vapor deposition methods (e.g., ion-plating, ECR plasma sputtering, ECR plasma CVD, surface wave plasma CVD, ICP-CVD, or the like).

[Patent Document 1] Japanese Unexamined Patent Application Publication No. 2001-284041

SUMMARY OF THE INVENTION

However, thin films (gas barrier layers) formed by the above-described technique are high-density and very rigid. Thus, if convexities and concavities, and steep steps exist on a surface to be covered with the thin film, external stress is concentrated in the formed thin layer, so that the thin layer will be cracked or peeled off. As a result, problems occur in that the shielding properties of the thin layer is deteriorated. Especially, in the case in which partitions called banks are provided to section a plurality of light-emitting layers, the surface of the layers, which is to be covered with a gas barrier layer, becomes concave and convex due to the banks. Thus, the above-described problems occur.

Therefore, in some cases, an underlying layer is provided to make the gas barrier layer flat, so that stress concentration in the gas barrier layer is relaxed. However, if a material for forming the underlying layer has a fluidity, the material will flow when the underlying layer is solidified. Thus, problematically, it is difficult to form a flat underlying layer (upper surface).

Moreover, to suppress stress from being generated on the gas barrier layer, it is desired that the underlying layer is formed with a material of which the volume-change occurs with much difficulty.

In view of the foregoing, the present invention has been devised. It is an object of the present invention to provide an electro-optical device in which the fluidity of a material to form a layer underlying a gas barrier layer is adjusted, and also, the volume of the formed underlying layer is suppressed from changing, so that stress-concentration in the gas barrier layer is relaxed, and peeling or cracking is eliminated, a method of producing the same, and an electronic apparatus.

To solve the above-described problems, the electro-optical device, the method of producing the same, and the electronic apparatus employ the following means.

According to a first invention, in an electro-optical device having, on a substrate, a plurality of first electrodes, a bank structure containing a plurality of openings positioned correspondingly to the formed first electrodes, electro-optical layers arranged in the openings, respectively, and a second electrode covering the bank structure and the electro-optical layers, the device includes a buffer layer formed so as to cover the second electrode and have a substantially flat upper surface, and a gas barrier layer covering the buffer layer. According to this invention, the buffer layer relaxes stress which is generated due to the distortion and the volume-change occurring on the substrate side. Accordingly, the second electrode can be prevented from peeling off from the unstable bank structure. Moreover, since the upper surface of the buffer layer is substantially flat, the gas barrier layer made of a rigid coat and formed on the buffer layer becomes flat. Thus, sites into which the stress is concentrated can be eliminated from the gas barrier layer. Thereby, the gas barrier layer can be prevented from cracking.

The buffer layer is made of an organic resin material having a lipophilic property, and is a cured coat formed by removing water, an organic solvent component, and the like under a reduced pressure after the coating of the organic resin material. In this case, since water is removed, the deterioration-prevention effect for the electro-optical layers is high.

Moreover, the buffer layer is made from a UV curable resin. In this case, the buffer layer can be cured by no use of heating. Thus, hazardous influences over the light emitting layers, which will occur due to the heating, can be suppressed.

Furthermore, the buffer layer is formed with a material comprising a silicon-containing organic resin. The adhesiveness of the buffer layer to the gas barrier layer or the like can be enhanced. Thus, the peeling or cracking, which will occur due to the distortion or stress, can be prevented.

Moreover, the buffer layer is formed with an organic material containing a nitrogen atom in the principal chain. In this case, the buffer layer can be cured at a temperature lower than the heat resistance temperature of the light emitting layers. Thus, damages to the light emitting layers can be eliminated.

In the case of the buffer layer containing fine particles, the volume-change, which occurs when a film is formed or the temperature changes, can be suppressed. This serves for reducing a load to the gas barrier layer.

In the case of the fine particles having a particle size of 10 nm to 1000 nm, the fine particles can enter the concavities and convexities and the steep steps which are formed due to the bank structure. When the fine particles have substantially the same particle sizes, the upper surface of the buffer layer can be easily formed.

In the case of the fine particles contained in the buffer layer in such an amount as gives a content of 10 wt % to 70 wt %, the buffer layer material can be suppressed from flowing away when the buffer layer is formed. Furthermore, the flat upper surface can be easily formed.

In the case of the fine particles having a refractive index different from that of the buffer layer, the fine particles having a different refractive index from that of the buffer layer are connected into chains to form an optical guide. Thus, the efficiency at which light is taken out from the light emitting layers can be enhanced.

In the case of an electrode protection layer to prevent the corrosion of the second electrode provided between the second electrode and the buffer layer, the second electrode can be prevented from corroding. The electro-conductivity of the second electrode can be satisfactorily maintained.

In the case of the electrode protection layer formed with a UV absorptive material, the electrode protection layer absorbs UV rays. Thus, hazardous influences over the light emitting layers, which will be exerted by UV rays during formation of the buffer layer, can be suppressed.

In the case of the walls defining the openings of the bank structure which have an angle to 110° to 170° to the substrate thereof, the light emitting layers can be easily arranged in the openings. Thus, the light emitting layers can be satisfactorily formed.

In the case of the walls defining the openings of the bank structure which are liquid-repellent at least at the surfaces thereof, the light emitting layers can be assuredly arranged in the openings.

In the case of the buffer layer which covers the bank structure, ranging over the bank structure, so that the bank structure is not exposed, the concavities and convexities formed on the surface of the second electrode, which occur due to the bank structure, can be completely made flat.

In the case of the gas barrier layer which covers the buffer layer, ranging over the buffer layer, so that the buffer layer is not exposed, the substantially whole surface of the gas barrier layer can be made flat.

In the case of the gas barrier layer and/or the electrode protection layer which is formed so as to come into contact with an insulation layer provided in the periphery of the substrate, the second electrode can be isolated from water or the like.

In the case of the electrode protection layer and the gas barrier layer which are formed so as to come into contact with each other in the outer periphery of the substrate, the second electrode can be completely isolated from water or the like.

In the case of the surface protection layer which is formed on the upper side of the gas barrier layer via an adhesion layer containing fine particles, the film-thickness of the adhesion layer can be easily uniform, due to the fine particles. Also, the fine particles form an optical guide, and the light take-up efficiency can be enhanced. When the fine particle are flexible material, an external stress can be dispersed.

According to a second invention, there is provided a method of producing an electro-optical device having, on a substrate, a plurality of first electrodes, a bank structure containing a plurality of openings positioned correspondingly to the formed first electrodes, electro-optical layers arranged in the openings, respectively, and a second electrode covering the bank structure and the electro-optical layers, comprising: a first step of arranging the buffer layer on the second electrode by a wet process, the buffer layer having a flat upper surface; and a second step of forming the gas barrier layer on the buffer layer. According to this invention, the buffer layer relaxes stress which is generated due to the distortion and the volume-change occurring on the substrate side. Accordingly, the second electrode can be prevented from peeling off from the unstable bank structure. Moreover, since the upper surface of the buffer layer is substantially flat, the gas barrier layer made of a rigid coat and formed on the buffer layer becomes flat. Thus, sites into which the stress is concentrated can be eliminated from the gas barrier layer. Thereby, the gas barrier layer can be prevented from cracking. Preferably, in the first step, a liquid buffer material is arranged on the second electrode by a wet process, and the liquid buffer material is cured at atmosphere of a water vapor partial pressure less than 50 Pa and preferably less than 1 Pa. Thereby, water contained in the buffer layer can be sufficiently reduced.

In the first step, the buffer layer is formed with an organic material containing fine particles. In this case, the fine particles can enter the concavities and convexities and the steep steps which are formed due to the bank structure. When the fine particles have substantially the same particle sizes, the upper surface of the buffer layer can be easily formed.

In the first step, the buffer layer is formed with an organic material containing a nitrogen atom in the principal chain. In this case, the buffer layer can be formed at a temperature lower than the heat resistance temperature of the light emitting layers. Thus, damages to the light emitting layers can be eliminated.

In the first step, a liquid buffer material is placed on the second electrode by a wet process, and the liquid buffer material is cured at atmosphere of a water vapor partial pressure less than 50 Pa. In this case, the water content of the buffer layer can be reduced. Thus, the deterioration prevention effect for the electro-optical layers can be enhanced.

According to a third invention, there is provided an electronic apparatus which includes the electro-optical device of the first invention or the electro-optical device manufactured by the method of the second invention. According to the present invention, the gas barrier layer is prevented from peeling off or cracking. Thus, the deterioration of the light emitting layers, which will occur due to water or the like, can be prevented. Thus, an electronic apparatus which is able to display a clear image for a long time-period can be provided.

DETAILED DESCRIPTION OF PREFERRED EMBODIMENTS

Hereinafter, embodiments of the electro-optical device, the method of producing the same, and the electronic apparatus of the present invention will be described with reference to the drawings.

As the electro-optical device, an EL display device using a field light-emissive substance, especially, an organic electroluminescence (EL) material will be described.

Figure 1:
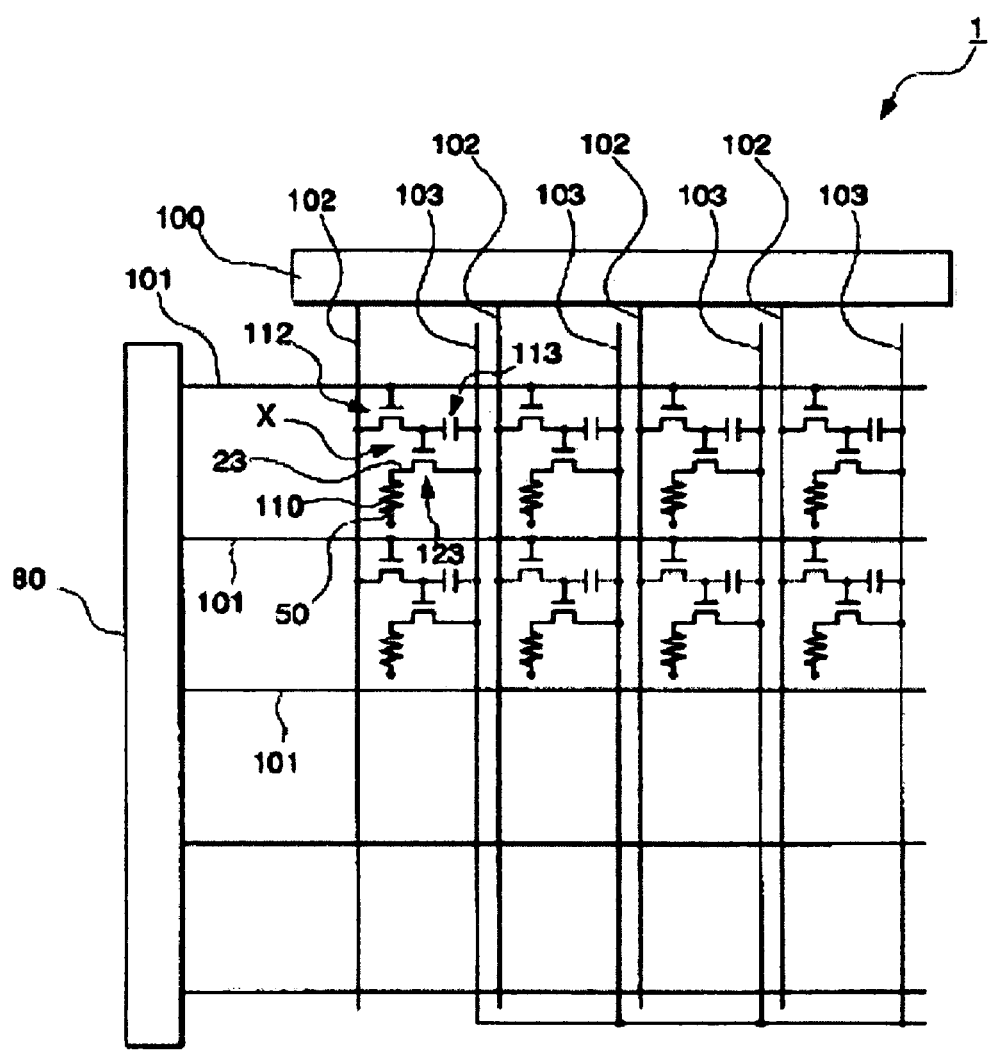
FIG. 1 shows the wiring structure of an EL display device.

FIG. 1 shows the wiring configuration of an EL display device 1. The EL display device 1 is an active matrix type EL display device containing thin film transistors (hereinafter, abbreviated to TFT) as switching elements.

Referring to the wiring-configuration of the EL display device (electro-optical device) 1, a plurality of scanning lines 101, a plurality of signal lines 102 extended in such a direction as to intersect the respective scanning lines 101 at a right angle, and a plurality of power-supply lines 103 which are extended in parallel to the signal lines 102 are arranged. Moreover, pixel regions X are provided near the intersecting points of the scanning lines 101 and the signal lines 102, respectively.

A data line drive circuit 100 provided with a shift register, a level shifter, a video line, and an analog switch is connected to the signal lines 102. A scanning line drive circuit 80 having a shift register and a level shifter is connected to the scanning lines 101.

Moreover, each pixel region X is provided with a switching TFT 112 having the gate electrode to which a scanning signal is supplied via the scanning line 101, a retention capacitor 113 retaining a pixel signal supplied via the signal line 102 and the switching TFT 112, a drive TFT 123 having the gate electrode to which the pixel signal retained in the retention capacitor 113 is supplied, a pixel electrode (electrode) 23 into which driving current is caused to flow via the power supply line 103 when the pixel electrode is electrically connected to the power supply line 103 via the drive TFT 123, and a functioning layer 110 sandwiched between the pixel electrode 23 and a cathode (electrode) 50. The pixel electrode 23, the cathode 50, and the functioning layer 110 constitute a light-emitting element (organic EL element).

When the scanning line 101 is driven so that the switching TFT 112 is turned on in the EL display device 1, the potential of the signal line 102 is retained in the retention capacitor 113. The on-off of the drive TFT 123 is determined depending on the state of the retention capacitor 113. Thus, electric current is caused to flow into the pixel electrode 23 via the power supply line 103 and the channel of the drive TFT 123. Moreover, electric current flows into the cathode 50 via the functioning layer 110. The functioning layer 110 emits light depending on the amount of electric current flowing through the functioning layer 110.

Hereinafter, the configuration of the EL display device 1 is specifically descried with reference to FIGS. 2 to 5.

The EL display device 1 is an active matrix type display device which comprises a plate 20 having an electrically insulating property, the pixel electrode regions (not shown) which are composed of the pixel electrodes connected to the switching TFT (not shown) and arranged in a matrix pattern on the plate 20, the power supply lines (not shown) arranged in the peripheries of the pixel electrode regions and connected to the respective pixel electrodes (not shown), and a pixel portion 3 (the area within the frame shown by the chain line in FIG. 2) positioned at least on the pixel electrode regions and having a rectangular shape as viewed in the plane.

Figure 3:
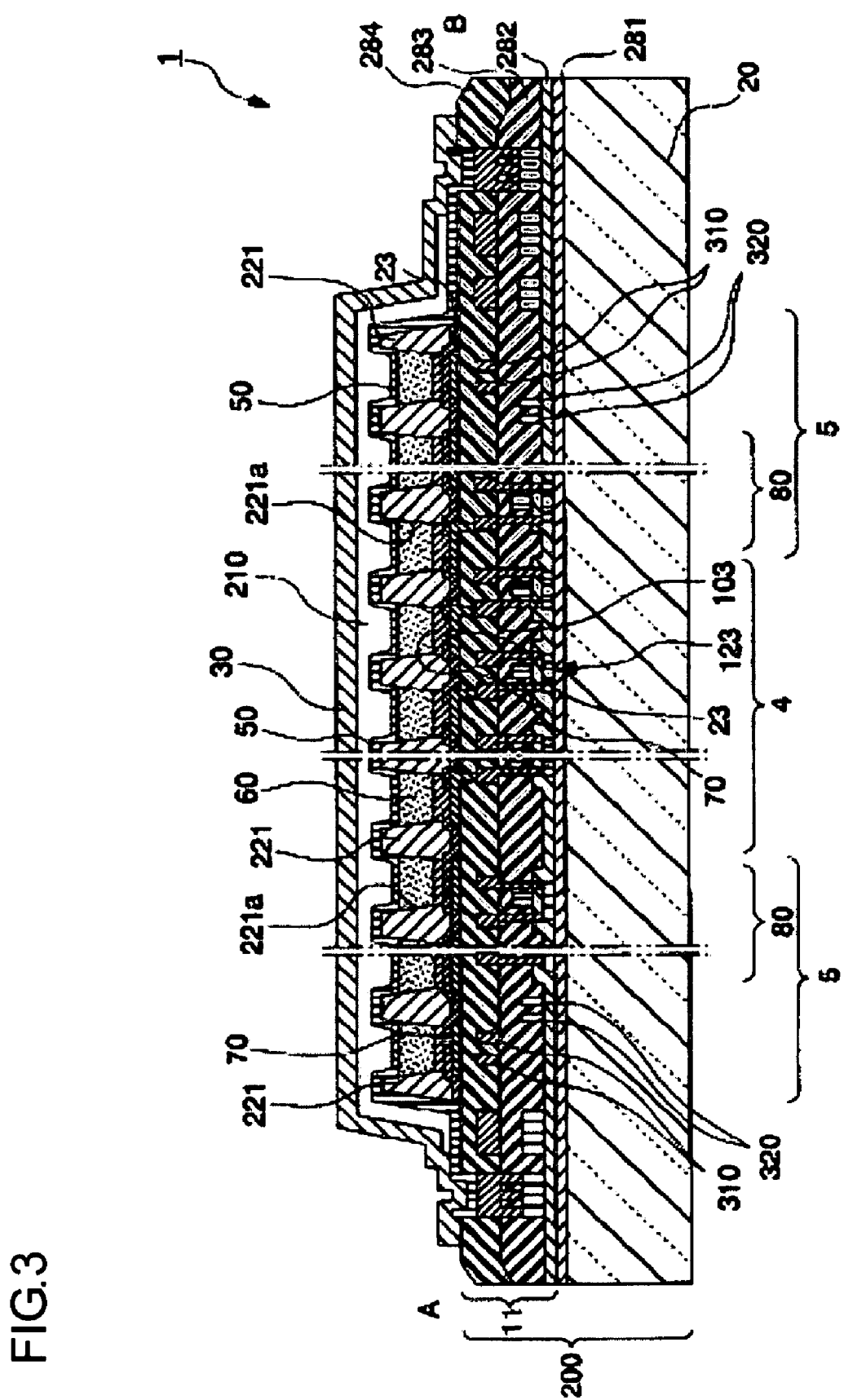
FIG. 3 is a cross-sectional view taken along line A-B in FIG. 2.
Figure 4:
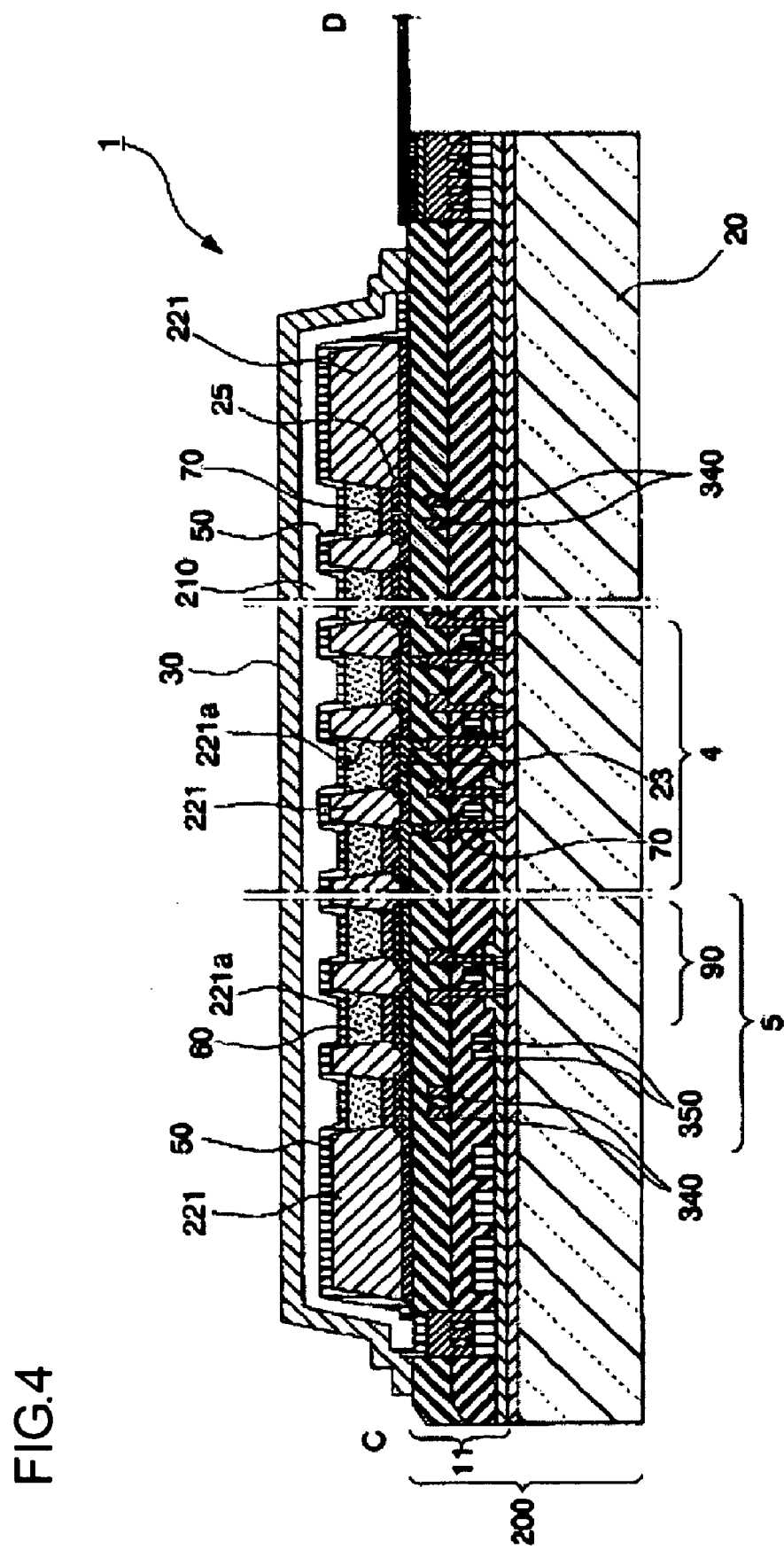
FIG. 4 is a cross-sectional view taken along line C-D in FIG. 2.

In this invention, the whole of the plate 20 and the switching TFTs, various circuits, interlayer insulating films is named a substrate (designated by reference numeral 200 in FIGS. 3 and 4). This will be described below.

Figure 2:
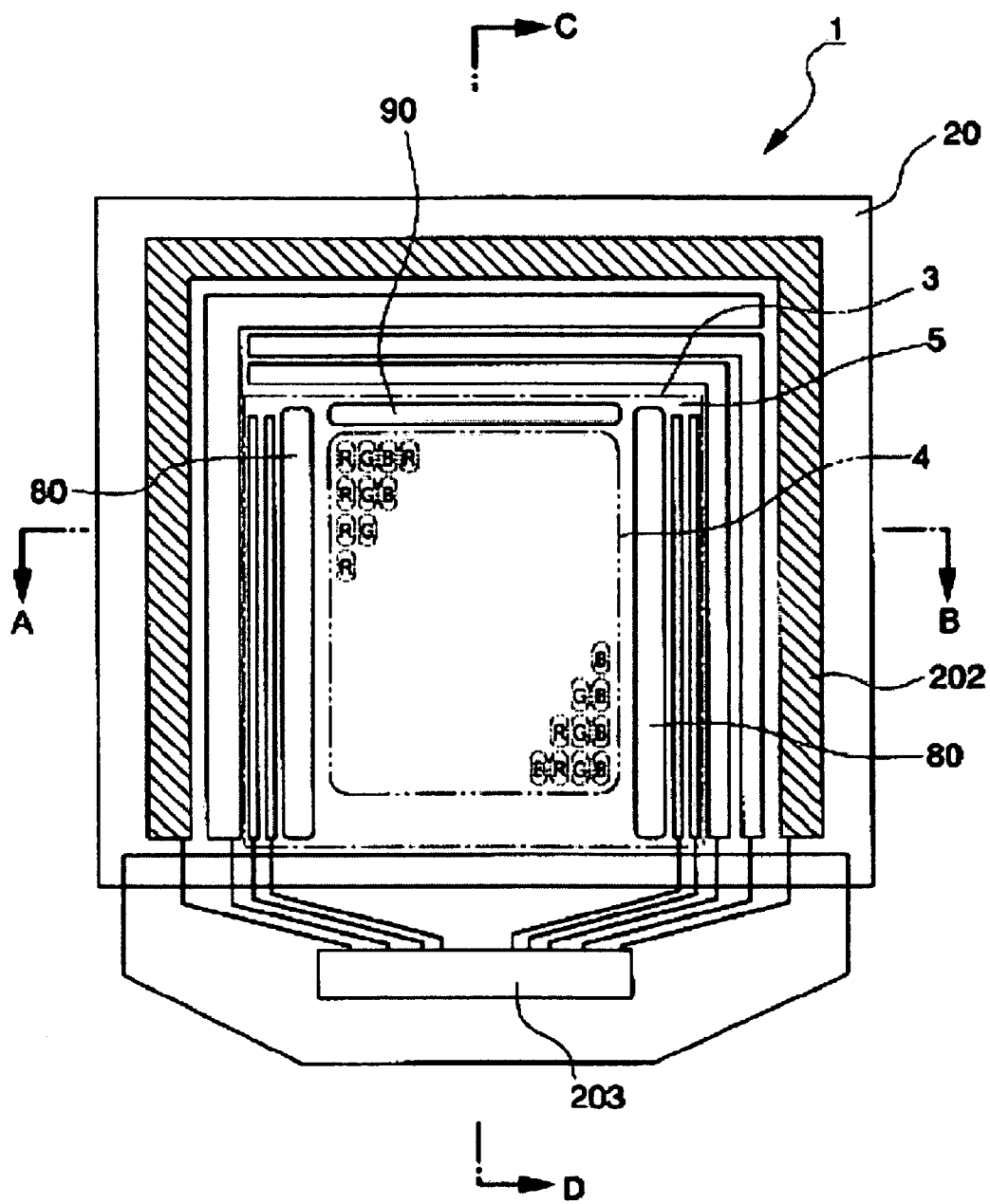
FIG. 2 is a schematic view of the structure of the EL display device.

The pixel portion 3 is sectioned into an actual display region 4 (defined to be within the frame shown by the two-dot chain line in FIG. 2) which is positioned in the center thereof, and a dummy region 5 formed in the periphery of the real display region 4 (defined between the one-dot chain line and the two-dot chain line).

In the actual display region 4, regions R, G, and B each containing the pixel electrode are arranged in a matrix pattern in such a manner as to be separated from each other in the direction A-B and in the direction C-D.

Moreover, the scanning line drive circuits 80 and 80 are arranged on both sides of the actual display region 4 as shown in FIG. 2. The scanning line drive circuits 80 and 80 are disposed under the dummy region 5.

Moreover, a check circuit 90 is provided on the upper side as viewed in FIG. 2 of the actual display region 4. The check circuit 90 checks the operation of the EL display device 1. For example, the check circuit 90 has a check-result output means (not shown) for outputting a check result to the outside thereof, so that the qualities and faults of the display device can be checked during the production or at shipment. The check circuit 90 is also arranged under the dummy region 5.

The scanning line drive circuits 80 and 80 and the check circuit 90 are configured so that drive voltages can be supplied from predetermined power-supplies to the circuits 80 and 90 via drive voltage conductors 310 (see FIG. 3) and drive voltage conductors 340 (see FIG. 4). A drive control signal and a drive voltage are transmitted and applied to the scanning line drive circuits 80 and the check circuit 90 from a predetermined main driver for operation-controlling the EL display device 1 via a drive control signal conductor 320 (see FIG. 3) and a drive voltage conductor 350 (see FIG. 4). In this case, the drive control signal means an instruction signal. The instruction signal is output from a main driver concerned with controlling which is carried out when signals are output from the scanning line drive circuits 80 and the check circuit 90.

In the EL display device 1, a plurality of light emitting elements (organic EL elements) having the pixel electrodes 23, the light emitting layers 60, and the cathodes 50 are formed on the substrate 200, and moreover, a buffer layer 210, a gas barrier layer 30, and so forth are formed so as to cover the light emitting elements.

Typically, the light emitting layer 60 may be a light emitting layer (electroluminescence layer) which is provided with a carrier injection layer or a carrier transport layer such as a hole injection layer, a hole transport layer, an electron injection layer, an electron transport layer, or the like, or provided with a hole blocking layer or an electron blocking layer.

Referring to the plate 20 constituting the substrate 200, in the case of a so-called top emission type EL display device, emitted light is caused to exit from the gas barrier layer 30 side which positions in opposition to the plate 20. Thus, a transparent plate and also an opaque plate can be employed. As an opaque plate, e.g., ceramics such as alumina or the like, metallic sheets of stainless steel or the like insulation-processed by surface-oxidation or the like, plates made of thermosetting resins or thermoplastic resins, films made of the resins (plastic films), and so forth may be used.

In the case of so-called bottom emission type EL display devices, emitted light is caused to exit from the plate 20 side.

Therefore, as the plate 20, transparent and translucent plates are employed. For example, plates made of glass, quartz, resins (plastics, plastic films) or the like may be used. Especially, glass plates are preferably employed. The display device according to this embodiment is a top emission type device, in which emitted light is caused to exit from the gas barrier layer 30 side. Thus, as the plate 20, the above-described opaque plates, e.g., opaque plastic films or the like are used.

Moreover, a circuit containing a drive TFT 123 or the like for driving the pixel electrodes 23 is formed on the plate 20. A plurality of light emitting elements (organic EL elements) are provided thereon. The light emitting element comprises the pixel electrode 23 which functions as an anode, a hole transport layer 70 through which a hole is injected/transported from the pixel electrode 23, the light emitting layer 60 containing an organic EL substance which is one of electro-optical materials, and the cathode 50, which are formed sequentially in that order.

According to the above-described constitution, a hole injected via the hole transport layer 70 couples with an electron via the cathode 50, so that light is emitted in the light emitting layer 60 of the light emitting element.

The display device of this embodiment is a top emission type one. Thus, the pixel electrode 23 need not be transparent. Thus, the pixel electrode is formed with an appropriate electro-conductive material.

As materials for forming the hole transport layer 70, e.g., polythiophene derivatives, polypyrrole derivatives, these materials doped therein, and the like are used. Specifically, dispersion liquids of 3, 4-polyethylenedioxythiophene/polystyrenesulfonic acid (PEDOT/PSS) is used. That is, e.g., a dispersion liquid produced by dispersing 3, 4-polyethylenedioxythiophene into polystyrenesulfonicacid as a dispersion medium, and further dispersing it into water is used.

As materials for forming the light emitting layer 60, known light emissive materials capable of emitting fluorescence or phosphorescence can be employed. Specifically, (poly)fluorene derivatives (PF), (poly)paraphenylenevinylene derivatives (PPV), polyphenylene derivatives (PP), polyparaphenylene derivatives (PPP), polyvinylcarbazole (PVK), polythiophene derivatives, polysilane type materials such as polymethylphenylenesilane (PMPS), and so forth are suitably used.

Moreover, into the above-described polymer materials, polymer materials such as perylene type color matters, cumarine type color matters, Rhodamine type color matters, or the like, and low molecular-weight materials such as rubren, perylene, 9, 10-diphenylanthracene, tetraphenylbutadiene, Nile red, cumarine 6, quinacrydone, and the like may be doped and used.

It should be noted that known low molecular weight materials may be used instead of the above-described polymer materials.

Moreover, an electron injection layer may be formed on the light emitting layer 60, if necessary.

Figure 5:
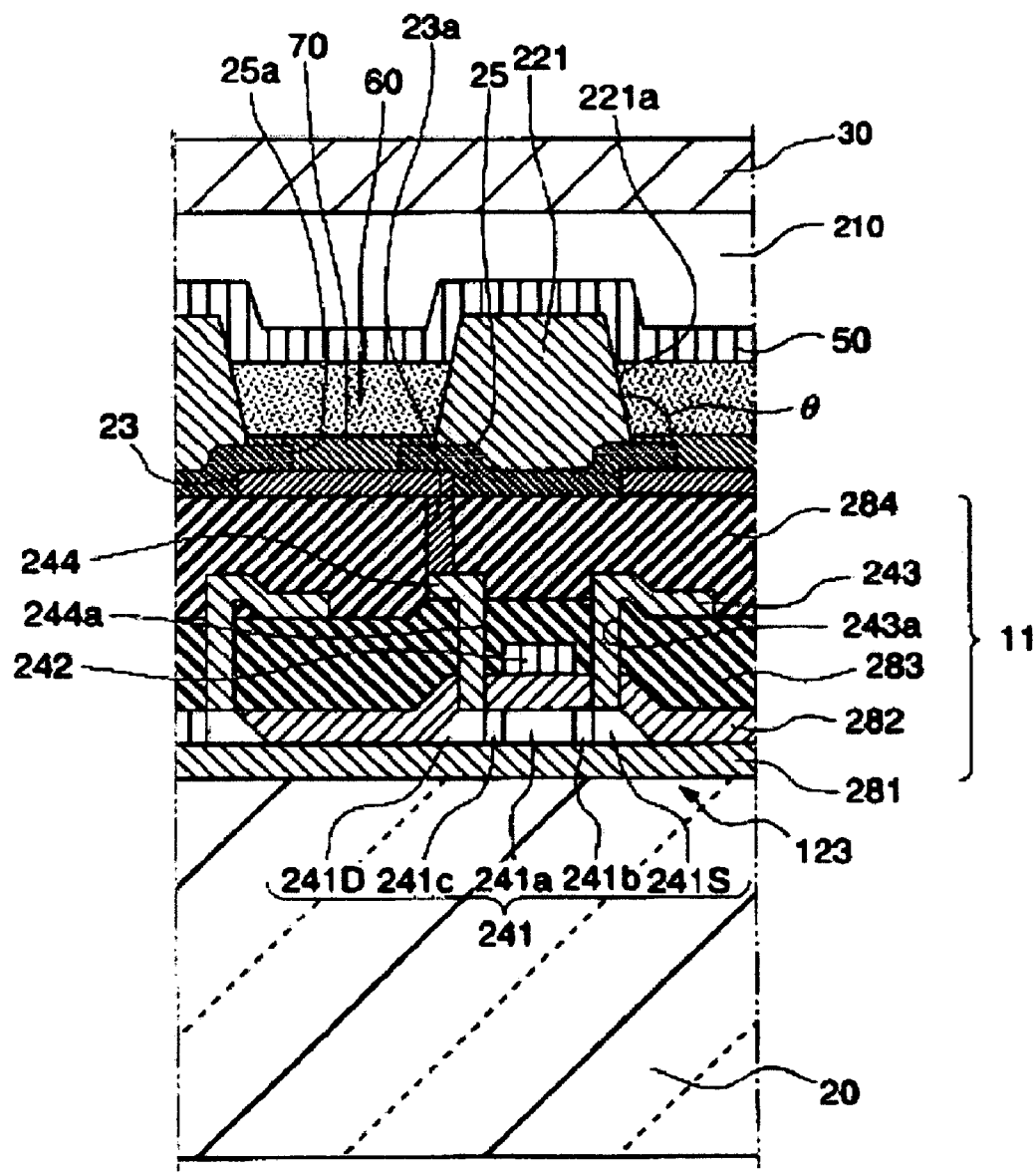
FIG. 5 is an enlarged cross-sectional view of the essential part shown in FIG. 3.

According to this embodiment, the hole transport layers 70 and the light emitting layers 60 are surrounded by a liquid-philic property controlling layer 25 and an organic bank layer 221 formed in a grating pattern on the substrate 200, as shown in FIGS. 3 to 5. Thereby, the hole transport layers 70 and the light emitting layers 60 surrounded as described above form an element layer which is a single light emitting element (organic EL element).

The angle θ of the respective walls of an opening 221a of the organic bank layer 221 to the surface of the substrate 200 is set to be in the range of 110° to 170° (see FIG. 5). The light emitting layer 60, when it is formed by a wet process, can be easily arranged in the opening 221 since the angle θ is set as described above.

The cathode 50, having an area larger than the total area of the actual display region 4 and the dummy region 5, is formed so as to cover the regions 4 and 5 as shown in FIGS. 3 to 5. Thus, the cathode 50 is formed on the substrate 200, covering the upper surfaces of the light emitting layers and the organic bank layers 221, and the walls of the outer side-portions of the organic bank layers 221. The cathode 50 is connected to a wiring 202 for the cathode which is formed on the outer side of the organic bank layer 221 and in the outer periphery of the substrate 200 as shown in FIG. 4. A flexible substrate 203 is connected to the wiring 202 for the cathode. Thereby, the cathode 50 is connected to a drive IC (drive circuit)(not shown) on the flexible substrate 203 via the cathode wiring 202.

For the cathode 50, a material having a high electron-injection effect is suitably used. For example, metals of calcium, magnesium, sodium, and lithium, and the metallic compounds of them are used. The metallic compounds include metal fluorides such as calcium fluoride or the like, metal oxides such as lithium oxide or the like, and organic metal complexes such as acetylacetonatocalcium or the like. These materials have a high electric resistance and can not function as an electrode when singly used. Accordingly, these materials may be used in combination with metal layers of aluminum, gold, silver, copper, or the like, and metal oxide electro-conductor layers of ITO (Indium tin oxide), tin oxide, or the like, i.e., in the form of a laminate. According to this embodiment, a laminate containing lithium fluoride, a metal of magnesium, or ITO has a film-thickness at which the laminate is transparent.

A cathode-protection layer 55 may be formed on the cathode 50. The thickness of the cathode-protection layer 55 is very thin, and is not shown in the drawings.

The cathode-protection layer 55 is provided to prevent the cathode 50 from being corroded during the production process, and is formed of an inorganic compound, e.g., ITO or a silicon compound such as a silicon oxide, a silicon nitrides, a silicon nitride oxide or the like. Since the cathode 50 is covered with the cathode-protection layer 55, oxygen or the like can be effectively prevented from intruding into the cathode 50 which is made of metals of calcium, magnesium, sodium, lithium, or the like, or metal compounds of them. The cathode-protection layer 55 having a film-thickness of about 10 nm to 300 nm is formed so as to extend onto an insulation layer 284 in the outer periphery of the substrate 200.

A buffer layer 210 is formed on the cathode 50 so as to range over the organic bank layer 221 and also so as to cover the cathode 50. The buffer layer 210 is formed so as to fill the concavities and convexities of the cathode 50 which is formed in a concave and convex pattern due to the shape of the organic bank layer 221, so that the upper surface of the buffer layer 210 becomes flat.

The buffer layer 210 has a function of relaxing a stress which is generated due to deflection and the change of volume occurring on the substrate 200 side. Thus, the buffer layer 210 prevents the cathode 50 from being peeled from the organic bank layer 221 which are not stable. In addition, since the upper surface of the buffer layer 210 is substantially flat, a gas barrier layer 30 made of a rigid film, which is formed on the buffer layer 210, becomes flat. Thereby, sites on which stress concentrates can be eliminated. Thus, the gas barrier layer 30 can be prevented from cracking.

For the buffer layer 210, polymer materials which are lipophilic and have a low water-absorptivity, i.e., polyolefin-type or polyether-type materials can be used. Moreover, organic silicone polymers produced by the hydrolysis and condensation of alkoxysilanes such as methyl triethoxysilane, tetraethoxysilane, or the like. Furthermore, the adhesion of the buffer layer 210 to the cathode 50 and the gas barrier layer 30 at the interfaces thereof can be enhanced by use of polymer materials containing silicone compounds, e.g., silane coupling agents such as 3-aminopropyl trimethoxysilane, 3-glycidoxypropyl trimethoxysilane or the like.

Moreover, for the buffer layer 210, UV curable resins containing, as a major component, methacrylate resins, epoxy resins, or the like can be used. Moreover, the buffer layer 210 can be formed into a film without heat-treatment, since the UV curable resin is used. Thus, a hazardous influence over the light emitting layer 60, which will be exerted by heating, can be eliminated. In this case, it is desirable that the cathode-protection layer 55 is made of a UV absorptive material. For example, an oxide semiconductor material having an energy band gap of 2 to 4 eV such as titanium oxide, zinc oxide, indium tin oxide (ITO) or the like is used for at least a part of the cathode-protection layer 55, so that UV rays transmitted through the buffer layer 210 are absorbed by the cathode-protection layer 55. Thus, the UV rays irradiated to the buffer layer 210 can be prevented from exerting a hazardous influence over the light emitting layer 60.

For the buffer layer 210, organic polymers containing nitrogen atoms in the principal chains can be used. For example, the polymers are produced by polymerization of, e.g., acrylic resins, epoxy resins, polyester, polyether, polyalcohol, or the like as a major component with a material containing isocyanate compounds (containing —N=C=O group) such as tolylene diisocyanate, xylylene diisocyanate, and so forth, amine compounds (containing a —NH$_2$ group or —NH group) such as diethylene triamine, m-phenylene diamine and so forth, or the like. These polymers have urethane linkages, amide linkages, and urea linkages. Thus, the polymers have a structure containing nitrogen atoms in the principal chains.

The Isocyanate compounds and the amine compounds have a high reactivity, and can react with the hydroxyl groups and the carboxyl groups of the polymers even at low temperature, so that the polymerization proceeds. Thus, the curing-reaction of the isocyanate compounds and the amine compounds can be performed at a low temperature of up to 120° C. Moreover, the surface free energies of the polymers having nitrogen atoms in the principal chains are high due to the polarity of the nitrogen atoms. Therefore, the adhesion of the buffer layer 210 to the inorganic compound layers, i.e., the cathode-protection layer 55, the gas barrier layer 30, and so forth is enhanced. Accordingly, the multi-layer structure having a high durability can be formed.

Moreover, the isocyanate compounds react with water. Thus, the urea-linkage reaction occurs, resulting in the formation of a polymer. This reaction causes the water remaining in the buffer layer 210 to be fixed. Thus, the water can be prevented from intrude into the cathode 50 and the light emitting layer 60.

Moreover, fine particles 211 are added to (be contained in) the buffer layer 210. The fluidity of a material for forming the buffer layer 210 can be adjusted by the addition of the fine particles. Moreover, since the buffer layer 210 contains the fine particles 211, the volume of the buffer layer 210 can be suppressed from changing, which occurs when the film is formed, or the temperature is changed. This reduces the load which is to be applied to the gas barrier layer 30.

The fine particles 211 contained in the buffer layer 210 are made of organic polymer materials or inorganic oxide materials. For example, polyester, PMMA (polymethylmethacrylate), silica, and alumina are preferable. The fine particles 211 are surface-treated, e.g., silane-coupling-treated, so that the fine particles 211 become more compatible with the materials for the buffer layer 210.

The fine particles 211 have a particle size of about 10 nm to 1000 nm, and is added to the buffer layer 210 in such an amount as gives a content of 10% to 70%. Thus, the fine particles 211 can enter the stepped portions of the openings 2219 or the like of the organic bank layer 221. Thus, a satisfactory layer without gaps can be formed. Moreover, since the fine particles 211 having substantially the same particle-sizes are contained, the upper surface of the buffer layer 210 can be made flat. Preferably, a larger amount of the fine particles 211 are added. However, if the content exceeds 80%, the strength of the buffer layer 210 becomes insufficient. Thus, the film-shape of the buffer layer 210 can not be kept in some cases. Therefore, the content of 80% or higher should be avoided.

Moreover, desirably, the fine particles 211 are made of a material with a refractive index n of about 1.2 to 2.0. For example, the fine particles 211 (e.g., n=1.46 for silica fine particles) having a refractive index n different from that of the buffer layer 210 (e.g., non-crystalline polyolefin with n=1.53) have a chain-structure so that an optical waveguide is formed. Thereby, the efficiency at which light is taken out from the light emitting layer 60 can be enhanced.

The particle sizes of the fine particles 211 need not be the same. The fine particles 211 may comprise particles having different particle sizes. For example, regarding the fine particles 211 for use in the formation of the flat upper surface of the buffer layer 210, the particle sizes may be set at 1000 nm. Regarding the fine particles 211 which function as an optical waveguide or can enter gaps, the particle sizes may be set at 10 nm.

Moreover, the gas barrier layer 30 is formed on the buffer layer 210 in such a manner that the part of the buffer layer 210 exposed on the substrate 200 is covered with the barrier layer 30. The gas barrier layer 30 is extended onto an insulation layer 284 in the outer periphery of the substrate 200. The gas barrier layer 30 may be formed so as to come into contact with the cathode-protection layer 55 on the insulating layer 284.

The gas barrier layer 30 is provided so that oxygen or water is prevented from intruding into the inner side of the gas barrier layer 30. Thus, oxygen or water is prevented from intruding into the cathode 50 and the light emitting layer 60. Thus, deterioration or the like of the cathode 50 and the light emitting layer 60, which will be caused by oxygen or water, can be suppressed.

For example, the gas barrier layer 30 is formed with an inorganic compound, preferably with a silicon compound such as silicon nitride, silicon oxide nitride, silicon oxide, or the like. Moreover, the gas barrier layer 30 may be formed with, e.g., alumina, tantalum oxide, titanium oxide, or other ceramics. In the case in which the gas barrier layer 30 is formed with the inorganic compound, and the cathode 50 is made of, e.g., ITO, the adhesion of the gas barrier layer 30 to the part of the cathode 50 is enhanced. Thus, the gas barrier layer 30 becomes a high-density layer without defects, so that the barrier property against oxygen and water is more enhanced.

Further, the gas barrier layer 30 may have a structure in which layers made of e.g., above-described different silicon compounds are laminated to each other. Specifically, preferably, silicon nitride and silicon nitride oxide are formed in that order from the cathode 50 side, or silicon oxide nitride and silicon oxide are formed in that order from the cathode 50 side, so that the gas barrier layer 30 is formed. In addition to the above-described combinations, preferably, at least two layers made of silicon oxide nitrides having different composition ratios are laminated, so that the oxygen concentration of the layer on the cathode 50 side is lower than that of the layer existing on the outer side.

According to the above-described structure, the oxygen concentration on the cathode 50 side is lower than that on the side opposite to the cathode 50 side. Accordingly, oxygen contained in the gas barrier layer 30 can be prevented form passing through the cathode 50 and reaching the light emitting layer 60 positioned on the inner side. Thus, the deterioration of the light emitting layer 60 can be prevented. The service life of the light emitting layer 60 can be increased.

Moreover, the composition of the gas barrier layer 30 may be heterogeneous, not employing a lamination-structure. That is, the oxygen concentration of the gas barrier layer 30 may be continuously changed, or may be discontinuously changed. In this case, for the above-described reason, it is preferable that the gas barrier layer 30 is formed so that the oxygen concentration on the cathode 50 side is lower than that on the outer side.

Moreover, preferably, the thickness of the gas barrier layer 30 is in the range of 10 nm to 500 nm. If the thickness is less than 10 nm, perforations may be formed in the part of the gas barrier layer 30 due to film-defects, the dispersion of the film-thickness or the like, so that the gas barrier property is damaged. If the film-thickness exceeds 500 nm, the gas barrier layer 30 may be cracked due to stress.

Moreover, the display device of this embodiment is a top emission type one. Accordingly, it is necessary for the gas barrier layer 30 to be light-transmissible. Thus, according to this embodiment, the light transmittance is set e.g., at 80% or higher in the visible range by appropriate adjustment of the material and the film-thickness of the gas barrier layer 30.

Figure 8:
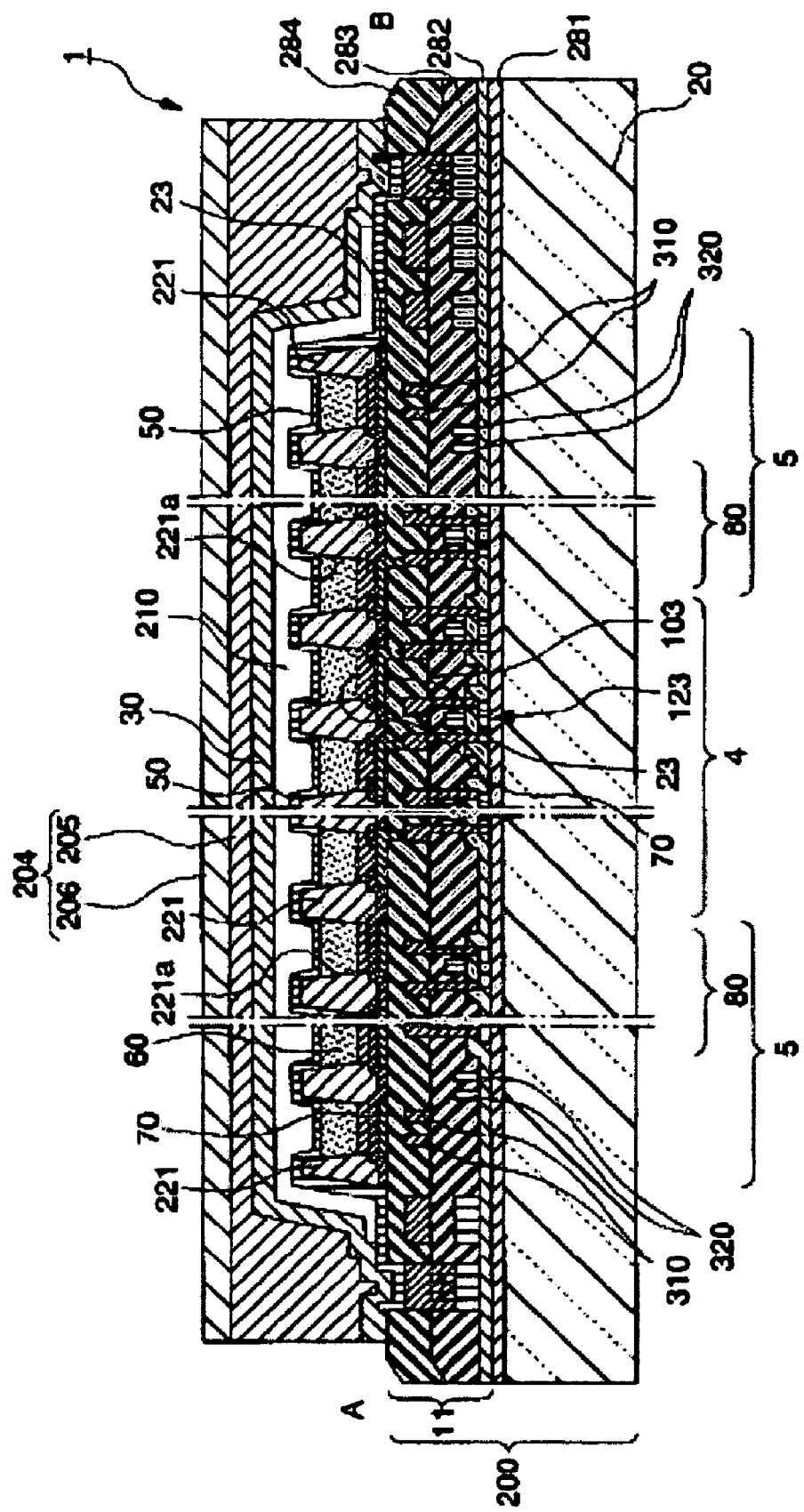
FIG. 8 illustrates the steps succeeding those of FIG. 7.

Moreover, a protection layer 204 is formed on the outer side of the gas barrier layer 30 so as to cover the gas barrier layer 30 (see FIG. 8). The protection layer 204 comprises an adhesion layer 205 formed on the gas barrier layer 30 side and a surface protection layer 206.

The adhesion layer 205 is effective in fixing the surface protection layer 206 onto the gas barrier layer 30, and functions so as to buffer mechanical impacts applied from the outside. The adhesion layer 205 is formed with an adhesive of which the material is more flexible and has a lower glass transition point compared with the surface protection layer 206. Examples of the material include urethane type resins, acryl type resins, epoxy type resins, polyolefin type resins, or the like. Preferably, a silane coupling agent or an alkoxysilane is added to the above-described adhesive. Thereby, the adhesion of the formed adhesive layer 205 to the gas barrier layer 30 is more enhanced. Accordingly, the buffering function for mechanical impacts becomes greater.

Especially, in the case in which the gas barrier layer 30 is formed with a silicon compound, the silane coupling agent and the alkoxysilane are effective in high adhesion between the adhesive layer 205 and the gas barrier layer 30. Accordingly, the gas barrier property of the gas barrier layer 30 can be enhanced.

Preferably, the adhesion layer 205 is also formed with a material containing as a major component a polymer having nitrogen atoms in the principle chain. This is because the light emitting layer 60 can be cured at low temperature, so that damage to the light emitting layer 40 is suppressed.

Also, the adhesion layer 205 may contain fine particles 207. For the adhesion layer 205 which contains the fine particles 207, the fine particles 207 function as a spacer, and the film-thickness of the adhesive layer 205 can be made substantially uniform. Moreover, the fine particles 207 function as an optical waveguide, so that the efficiency at which light is taken out from the light emitting layer 60 can be enhanced. Moreover, the fine particles 207, if they are flexible, can function so as to relax a stress applied from the outside.

Preferably, the fine particles 207 are the same as the above-described fine articles 211. Also, in this case, the particle sizes need not be uniform. For example, the particle sizes of the fine particles 207 which function as a spacer may be set at 1000 nm, while that of the fine particles 207 which function as an optical waveguide may be set at 10 nm.

The surface protection layer 206 is formed on the adhesion layer 205, and constitutes the surface side of the protection layer 204. The surface protection layer 206 has at least one of the properties of pressure durability, abrasion resistance, an external light reflection preventing property, a gas barrier property, a UV shielding property, and so forth. Specifically, the surface protection layer 206 is a polymer layer (plastic film), a DLC (Diamond-Like Carbon) layer, or is made of glass or the like.

In the case in which the EL display device of this embodiment is a top emission type one, both of the surface protection layer 206 and the adhesion layer 205 are required to be light-transmissible. However, in the case of a bottom emission type EL display device, the above-described requirement is not made.

A circuit portion 11 is provided below the above-described light emitting element as shown in FIG. 5. The circuit portion 11 is formed on the plate 20, and constitutes the substrate 200. Specifically, an underlying-layer protection layer 281 containing a major component of $SiO_2$ is formed, as an underlying layer, on the surface of the plate 20. A silicon layer 241 is formed thereon. A gate insulating layer 282 containing $SiO_2$ and/or SiN as a major component is formed on the surface of the silicon layer 241.

A region which is a part of the silicon layer 241 and overlap a gate electrode 242 with the gate insulating layer 282 being interposed between them is a channel region 241a. The gate electrode 242 is a part of a scanning line 101 (not shown). A first interlayer insulation layer 283 containing $SiO_2$ is formed on the surface of the gate insulation layer 282 which covers the silicon layer 241 and has the gate electrode 242 formed thereon.

Moreover, in the silicon layer 241, a low concentration source region 241b and a high concentration source region 241S are provided on the source side of the channel region 241a. On the other hand, a low concentration drain region 241c and a high concentration drain region 241D are provided on the drain side of the channel region 241a. Thereby, a so-called LDD (Light Doped Drain) structure is formed. Of these regions, the high concentration source region 241S is connected to a source electrode 243 via a contact hole 243a which passes through the gate insulation layer 282 and a first interlayer insulation layer 283. The source electrode 243 is formed as a part of the above-described power supply line 103 (see FIG. 1, and in FIG. 5, the power supply line is extended perpendicular to the drawing-paper plane at the position of the source electrode 243). On the other hand, the high concentration drain region 241D is connected to a drain electrode 244 composed of the same layer as the source electrode 243 via a contact hole 244a which passes through the gate insulation layer 282 and the first interlayer insulation layer 283.

The upper layer of the first interlayer insulation layer 283 having the source electrode 243 and the drain electrode 244 formed thereon is covered with a second interlayer insulation layer 284 containing as a major component, e.g., an acrylic type resin component. For the second interlayer insulation layer 284, materials other than acryl type insulation films such as SiN, $SiO_2$ or the like may be used. A pixel electrode made of ITO is formed on the surface of the second insulating layer 284, and is connected to the drain electrode 244 via a contact hole 23a formed in the second interlayer insulation layer 284. That is, the pixel electrode 23 is connected to the high concentration drain region 241D of the silicon layer 241 via the drain electrode 244.

TFTs (drive circuit TFTS) contained in the scanning line drive circuits 80 and the check circuit 80, i.e., N-channel or P-channel TFTs constituting the shift registers contained in these drive circuits have the same structure as the drive TFT 123 except that the N-channel or P-channel TFTs are not connected to the pixel electrode 23.

The pixel electrode 23, the above-described liquid-philic property control layer 25 and organic bank layer 221 are provided on the surface of the second interlayer insulation layer 284. The liquid-philic property control layer 25 contains a liquid-philic material such as $SiO_2$ or the like as a major component. The organic bank layer 221 is made of an acrylic type resin, polyimide or the like. The hole transport layer 70 and the light emitting layer 60 are laminated in that order in an opening 25a of the liquid-philic property control layer 25 and in an opening 221a surrounded by the organic bank layers 221, which are provided on the pixel electrode 23. It is to be noted that in this embodiment, "liquid-philic property" of the liquid-philic property control layer 25 is higher than that of the material constituting the organic bank layer 221 such as acrylic type resin, polyimide, or the like.

The layers ranging from the surface of the plate 20 to the second interlayer insulation layer 284 as described above constitute the circuit portion 11.

In this case, the respective light emitting layers 60 of the EL display device 1 of this embodiment are formed in such a manner that their light emission wavelength bands correspond to the primaries. For examples, as the light emitting layers 60, red-color light emitting layers 60R of which the light emission wavelength band corresponds to red color, green color light emitting layers 60G of which the light emission wavelength band corresponds to green color and blue-color light emitting layers 60B of which the light emission wavelength band corresponds to green color are formed in display regions R, Q and B, respectively. These display regions R, G, and B constitute one pixel which carries out color-display. BM (black matrix) (not shown) is formed in a film-shape in the boundaries between the color display regions, e.g., between the organic bank layer 221 and the liquid-philic property control layer 25, e.g., by sputtering metal chromium.

Hereinafter, an example of a method of producing the EL display device 1 according to this embodiment will be decried with reference to FIGS. 6 and 7. The cross-sectional views of FIGS. 6 and 7 correspond to the cross-sectional view taken along line A-B in FIG. 2.

According to this embodiment, the EL display device 1 as an electro-optical device is a top emission type one. The process of forming the circuit portion 11 on the surface of the plate 20 is the same as that according to a know technique. Thus, the description is not repeated.

Figure 6A:
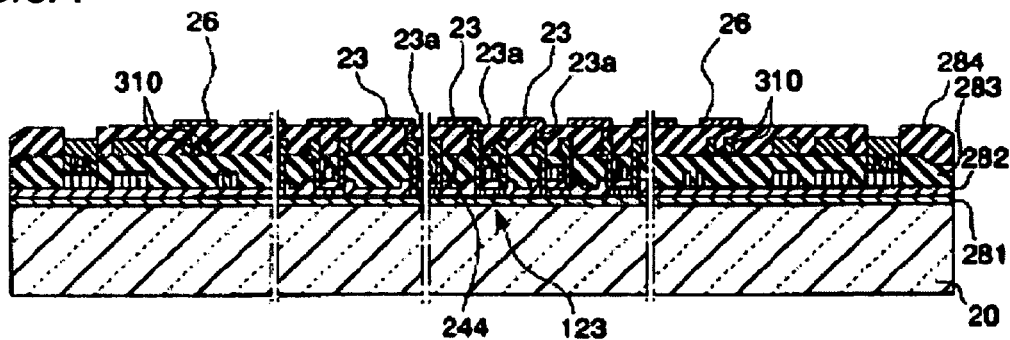
FIG. 6 sequentially illustrates the steps of a method of producing the EL display device.

First, as shown in FIG. 6(a), an electro-conductive film to form the pixel electrodes 23 are formed so as to cover the whole surface of the plate 20 having the circuit portion 11 formed thereon. Moreover, the transparent electro-conductive film is patterned, so that the pixel electrodes 23 connected to the drain electrodes 244 via the contact holes 23a of the second interlayer insulation layer 284 are formed. Simultaneously, a dummy pattern 26 is formed in a dummy region.

In FIGS. 3 and 4, the pixel electrodes 23 and the dummy pattern 26 are wholly named pixel electrodes 23. The dummy pattern 26 is formed so as not to be connected to the metal wiring of the lower layer via the second interlayer insulation layer 284. That is, the dummy pattern 26 has an islands-like pattern. The island-like portions have the same shape as that of the pixel electrodes 23 formed in the real display region. Needless to say, the dummy pattern 26 may have a structure of which the shape is different from the pixel electrodes 23 formed in the actual display region. In this case, the dummy pattern 26 contains at least the island-shaped portions which are positioned above a drive voltage conduction portion 310 (340).

Figure 6B:
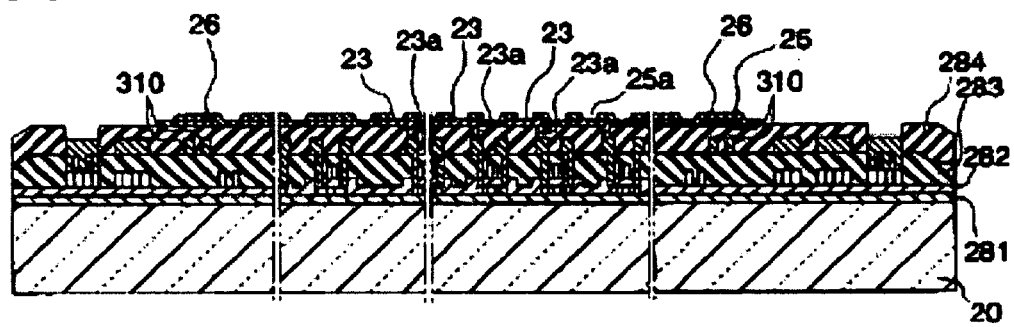

Subsequently, as shown in FIG. 6(b), the liquid-philic property control layer 25, which is an insulation layer, is formed on the pixel electrodes 23, the dummy pattern 26, and the second interlayer insulation film. The liquid-philic property control layer 25 is formed in such a manner that a part of the liquid-philic property control layer 25 is opened on the pixel electrodes 23. Thus, holes can be moved from the pixel electrodes 23 in the openings 25a (also, see FIG. 3). On the other hand, in the dummy pattern 26 not provided with the openings 25a, the insulation layer (liquid-philic property control layer) functions as a hole-movement blocking layer. Thus, no hole-movement occurs therein. Subsequently, in the liquid-philic property control layer 25, BM (black matrix) (not shown) is formed in concavities positioned between different two pixel electrodes 23. Specifically, films are formed in the concavities of the liquid-philic property control layer 25 by a sputtering method using metal chromium.

Figure 6C:
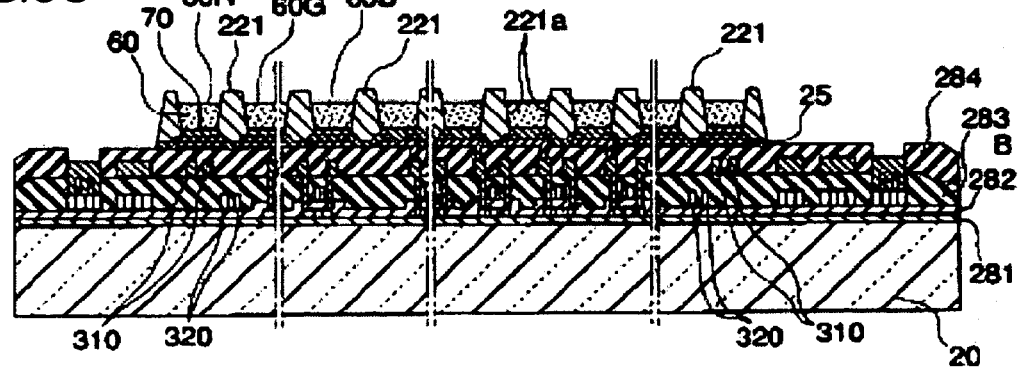

Thereafter, as shown in FIG. 6(c), the organic bank layers 221 are formed in the predetermined positions of the liquid-philic property control layer 25, i.e., so as to cover the above-described BM. Specifically, referring to the formation of the organic bank layers, e.g., acrylic resins, polyimide resins, or the like are dissolved in a solvent and applied by one of different coating methods such as spin coating, dip coating, and the like. Thus, an organic layer is formed. As a material for forming the organic layer, any type of materials may be employed, provided that the materials are insoluble in the solvents of ink described below, and can be easily patterned by etching or the like.

Moreover, the organic layer is patterned by a photolithographic technique and an etching technique, so that the openings 221a are formed in the organic layer. Thus, the organic bank layers 221 having walls in the openings 221a are formed. In this case, the walls defining the openings 221a are formed in such a manner that the angle $\theta$ of each wall to the surface of the substrate 200 is in the range of 110° to 170°.

In this case, it is defined that the organic bank layer 221 should include at least the pieces positioned above the drive control signal conduction portions 320.

Subsequently, a region exhibiting a liquid-philic property and a region exhibiting a liquid-repellent property are formed on the surface of each organic bank layer 221. According to this embodiment, the respective regions are formed by plasma-processing. Specifically, the plasma-processing is carried out by a preheating step, a step of giving the ink-philic property to the upper surfaces of the organic bank layer 221, the walls of the openings 221a, the electrode surfaces 23c of the pixel electrodes 23, and the upper surfaces of the liquid-philic property control layers 25, respectively, a step of giving an ink-repellent property to the upper surface of the organic bank layers 221 and the walls of the openings 221a, and a cooling step.

In particular, a base material (plate 20 including the banks or the like) is heated at a predetermined temperature of, e.g., about 70 to 80° C., and as the step of giving the ink-philic property, plasma-processing is carried out ($O_2$ plasma-processing) in an atmospheric environment using oxygen as a reaction gas. Subsequently, as the step of giving the ink-repellent property, plasma-processing is carried out in an atmospheric environment using tetrafluoromethane as a reaction gas ($CF_4$ plasma processing). Thereafter, the base material heated for the plasma-processing is cooled to a room temperature. Thus, the liquid-philic property and the liquid repellent property are rendered to the predetermined portions.

The electrode surfaces 23c of the pixel electrodes 23 and the liquid-philic property control layer 25 are affected to some degree by the $CF_4$ plasma-processing. However, ITO which is the material constituting the pixel electrodes 23, and $SiO_2$, $TiO_2$, or the like which is a material constituting the liquid-philic property control layers 25 have a low affinity to fluorine. Thus, the hydroxyl groups formed by the step of giving the ink-philic property are not substituted by fluoro-groups. Thus, the liquid-philic property can be maintained.

Then, in the step of forming a hole transport layer, the hole transport layers 70 are formed. In the step of forming a hole transport layer, a hole transport layer material is coated on the electrode surfaces 23c by a liquid-drop jetting method such as ink jet method or the like, a spin coat method, or the like followed by drying processing and heat treatment. Thus, the hole transport layers 70 are formed on the electrodes 23. In the case in which the hole transport layer material is selectively coated e.g., by an ink jet method, first, a hole transport layer material is charged in an ink jet head (not shown). The jetting nozzle of the ink jet head is placed so as to be opposed to the electrode surfaces 23c positioned in the openings 25 which is formed in the liquid-philic property control layers 25. While the ink jet head and the base material (plate 20) are relatively moved, liquid drops of which the amount per one drop is controlled are jetted through the jetting nozzle onto the electrode surfaces 23c. After jetting, the liquid drops are dried, so that the disperse medium or solvent contained in the hole transport layer material is evaporated off. Thus, the hole transport layers 70 are formed.

In this case, the liquid drops jetted through the jetting nozzle extends on the electrode surfaces 23c which is processed so as to have the liquid-philic property, and is filled into the openings 25a of the liquid-philic property control layers 25. On the other hand, the liquid drops repels from the upper surfaces of the organic bank layers 221 processed so as to have the ink-repellent property. Thus, the liquid drops are prevented from adhering to the upper surfaces. Accordingly, even if the liquid drops are departed from the predetermined jetting-positions and jetted onto the organic bank layers 221, the upper surfaces does not be wetted with the drops, and the repelled drops are rolled into the openings 25a of the liquid-philic property control layers 25.

Preferably, the process succeeding the step of forming the hole transport layers is carried out in an inert gas atmosphere such as a nitrogen atmosphere, an argon atmosphere, or the like, so that the oxidation of the hole transport layer 70 and the light emitting layer 60 can be prevented.

Then, the light emitting layers 60 are formed in the step of forming a light emitting layer. In this step, a material for forming a light emitting layer is jetted onto the hole transport layers 70, e.g., by an ink jet method, followed by drying and heat treatment. Thus, the light emitting layers 60 are formed in the openings 221a defined by the organic bank layers 221. In the step of forming a light emitting layer, to prevent the hole transport layers 70 from being dissolved again, a non-polar solvent incapable of dissolving the hole transport layers 70 is used as a solvent for use with a material for forming the light emitting layers.

In the step of forming the light emitting layers, a material for forming a blue color (B) light emitting layer is selectively coated on a blue color display region, and is dried. Thereafter, similarly, for green color (G) and a red color (R), materials are selectively coated in display regions, respectively, and are dried.

Moreover, electron injection layers may be formed on the light emitting layers 60, if necessary, as described above.

Figure 7D:
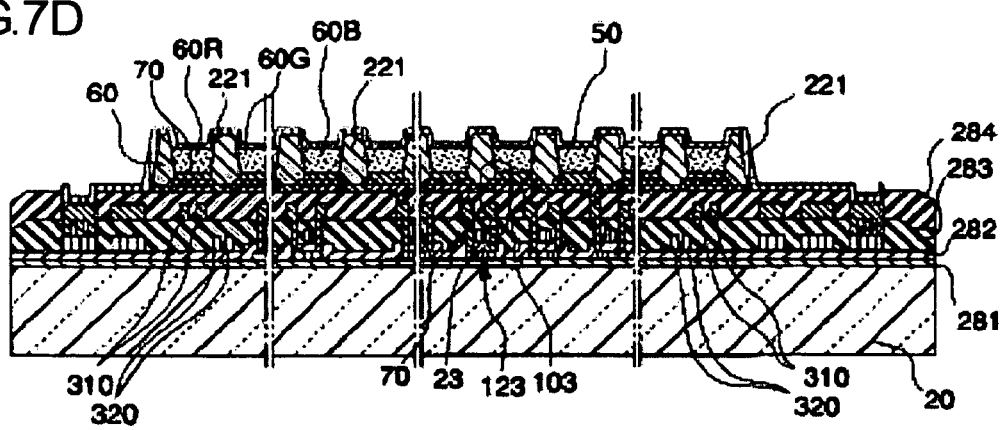
FIG. 7 illustrates the steps succeeding those of FIG. 6.

Subsequently, as shown in FIG. 7(d), a cathode 50 is formed in the step of forming a cathode layer. In the step of forming a cathode layer, e.g., ITO is formed into a film by a physical vapor deposition method (PVD) such as vacuum vapor deposition, ion plating, or the like. Thus, the cathode 50 is formed. In this case, the cathode 50 is formed so as to cover the upper surfaces of the light-emitting layers 60 and the organic bank layers 221 and also the walls of the outer side-portions of the organic bank layers 221.

In the case in which the cathode protection layer 55 is formed on the cathode 50, silicone oxide or the like is formed into a film on the cathode 50 by a high density plasma vapor deposition method.

Figure 7E:
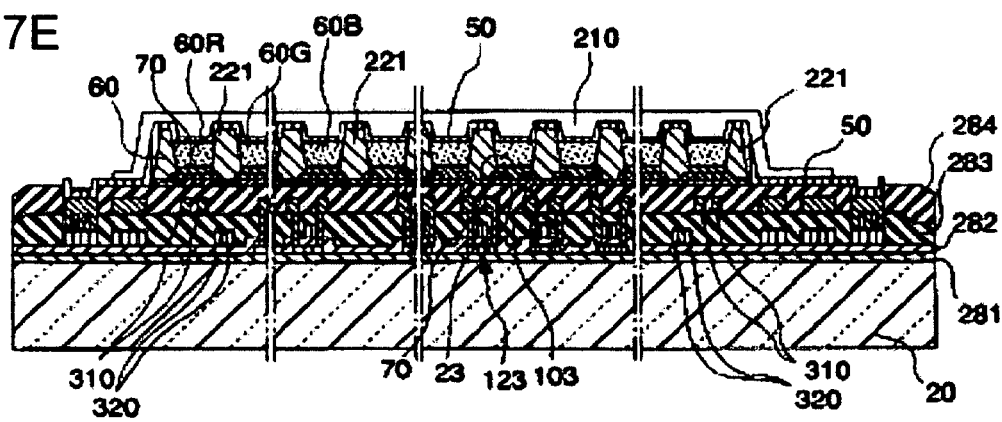

Subsequently, as shown in FIG. 7(e), the buffer layer 210 is formed by a coating method, i.e., a wet process. In the case in which the buffer layer is formed by an ink jet method, first, a material for the buffer layer is charged into an ink jet head (not shown). The jet nozzle of the ink jet head is positioned in opposition to the cathode 50. Liquid drops of which the liquid amount per one drop is controlled are jetted onto the cathode 50 through the jet nozzle while the ink jet head and the base material (plate 20) are relatively moved. The liquid drop amount is controlled corresponding to the concavities and convexities on the surface of the cathode formed by the sectioning walls, and thereby, the surface of the buffer layer 210 can be made flat. Thereafter, the jetted drops are dried, so that a disperse medium or solvent contained in the material for the buffer layer is evaporated off. Thus, the buffer layer 210 is formed. Preferably, the drying is carried out at a water vapor partial pressure less than 50 Pa, preferably, less than 1 Pa. This partial pressure is a value converted to the partial pressure at 20° C. In other words, on a dew point basis, preferably, the drying is carried out at a dew point less than −30° C., more preferably, at a dew point less than −65° C. Under these conditions, the water contained in the buffer layer 2 can be effectively reduced. Thus, the reliability of the electro-optical device can be enhanced. The removal of the solvent and the removal of water contained in the buffer layer 210 are carried out at a very low pressure, less than 1000 Pa, and thereafter, dried nitrogen gas is introduced into the atmosphere, so that the water vapor partial pressure can be adjusted to 0.2 Pa.

Moreover, a material for the buffer layer may be applied by a slit coating (or curtain-coating) method. The buffer material is extruded through a slit and coated onto the cathode. Therefore, the buffer material can be uniformly coated in a large area.

The fine particles 211 are added to the material for the buffer layer in such an amount as gives a predetermined content.

Moreover, if nitrogen is incorporated into the material for the buffer layer, an isocyanate compound or amine compound is added to the material for the buffer layer immediately before the material is coated. Thereby, the material for the buffer layer is polymerized after the coating, and is cured at a low temperature, i.e., at 120° C. or lower. When the buffer layer is formed at 120° C. or lower, polymer materials used in the light emitting layers or the like are not deteriorated. Preferably, the material for the buffer layer is cured in a temperature range of 60° C. to 80° C. If the curing temperature is less than 80° C., the deterioration of the light emitting layer 60 can be more reduced. Moreover, if the curing temperature is 60° C. or lower, the curing reaction of the buffer material is slow. Undesirably, the time required for the curing of the buffer material becomes long.

Figure 7F:
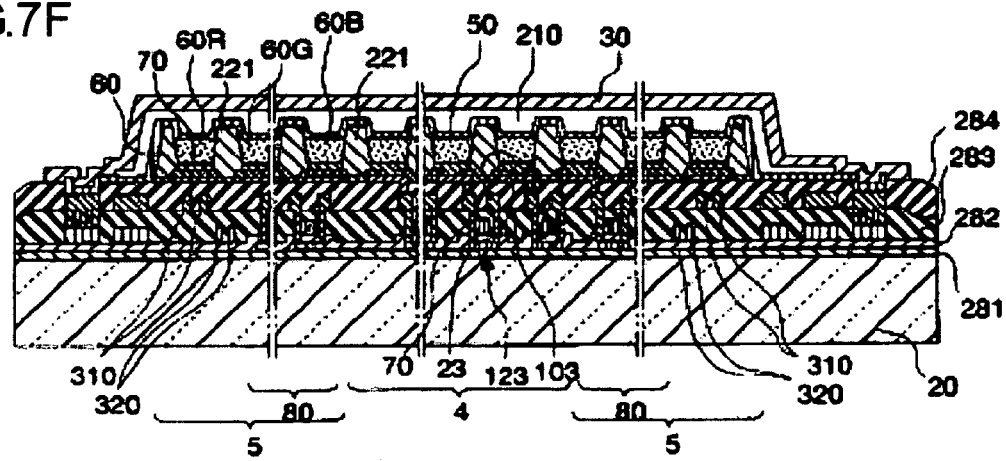

Thereafter, as shown in FIG. 7(f), the gas barrier layer 30 is formed so as to cover the cathode 50 and the buffer layer 210, i.e., so as to cover all of the exposed portions of the cathode 50 on the substrate 200.

Referring to the formation of the gas barrier layer 30, preferably, the gas barrier layer 30 is formed by a high density plasma vapor deposition method such as ion plating, ECR plasma CVD, or the like, which causes no plasma damages and can form a high-density film at low temperature. Moreover, plural film-forming methods may be used in combination. In particular, first, a film having a high adhesiveness may be formed by a physical vapor deposition method such as sputtering, ion plating, or the like, and subsequently, a film having a small stress, a high coverage, and no faults may be formed by a chemical vapor deposition method such as plasma CVD or the like.

Moreover, regarding the formation of the gas barrier layer 30, the gas barrier layer 30 may be formed as a single layer using the same material as described above. Moreover, the gas barrier layer 30 may be formed so as to be made up of plural layers laminated together using different materials. Furthermore, the gas barrier layer 30 may be formed as a single layer in which the composition is changed continuously or discontinuously in the thickness direction.

Referring to materials for forming the gas barrier layer 30, silicon compounds having a high chemical stability are preferable. Especially, silicon nitrides and silicon nitride oxides, which are high gas barrier properties, are preferable.

Moreover, when the gas barrier layer 30 is formed by a physical vapor deposition method, the amount of oxygen supplied into a film-formation apparatus may be controlled so that first, the amount is small, and then is increased continuously or discontinuously, so that the oxygen concentration in the formed gas barrier layer 30 is low on the cathode 50 side (inner side), and is higher on the outer side than that on the inner side.

Needless to say, the formation of the gas barrier layer 30 may be made by a single film-forming method. In this case, preferably, the gas barrier layer 30 is formed so that the oxygen concentration is relatively low on the cathode 50 side (inner side) as described above.

As shown in FIG. 8, the protection layer 204 comprising the adhesion layer 205 and the surface protection layer 206 are formed on the gas barrier layer 30. The adhesion layer 205 is formed by uniformly coating on the gas barrier layer 30 by a slit coating method or the like. Then, the surface protection layer 206 is bonded thereon.

The protection layer 204, provided on the gas barrier layer 30, has pressure-durability, an abrasion resistance, a light reflection prevention property, a gas barrier property, a UV shielding property, and so forth, and thus, the light emitting layers 60, the cathode 50, and the gas barrier layer can be protected by the surface protection layer 206. Thus, the service life of the light emitting element can be increased.

Moreover, the adhesion layer 205 has a function of buffering mechanical impacts. If an external mechanical impact is applied, the adhesion layer relaxes the mechanical impact which is given to the gas barrier layer 30 and the light emitting elements on the inner side. Thus, the function of the light emitting elements can be prevented from being degraded, which will occur due to the mechanical impact.

As described above, the EL display device is produced.

In the above-described EL display device 1, the buffer layer 210 is arranged between the cathode 50 and the gas barrier layer 30. The buffer layer 210 covers the cathode 50, and the formed upper surface thereof is substantially flat. Thus, the buffer layer 210 is effective in relaxing stress which is generated by distortion or volume-change on the substrate 200 side, and moreover, can prevent the cathode 50 from being peeled off from the organic bank layers 221 which are unstable.

Moreover, since the upper surface of the buffer layer 210 is substantially flat, the gas barrier layer 30 of a rigid coat formed on the buffer layer 210 becomes flat. As a result, sites where stress may concentrate are eliminated from the gas barrier layer 30. Thereby, the gas barrier layer 30 can be prevented from cracking.

Moreover, the buffer layer 210 contains the fine particles 211. Thus, the buffer layer 210 can be suppressed from changing in volume with the temperature. Accordingly, a load applied to the gas barrier layer 30 can be reduced.

When the buffer layer 210 is formed below the heat resistant temperature of the light emitting layers 60, no damages are given to the light emitting layers 60. Thus, the service life of the EL display device can be increased.

Moreover, according to the EL display device 1, the following sealing effect can be obtained.

The EL display device was left to stand in an environment of 90% RH at 60° C., and the time till a dark spot (non-light-emitting region) was generated was determined. The film-thicknesses of the cathode protection layer 55 (silicon oxide), the buffer layer 210, and the gas barrier layer 30 were 50 nm, 3 µm, and 100 nm, respectively. For the buffer layer 210 made from an acrylic resin only, the generation of a dark spot was confirmed about 50 to 100 hours after the device was left to stand. On the other hand, for the buffer layer 210 made from a material comprising an organic polymer having a nitrogen atom incorporated in the principal chain, e.g., a polymer produced by polymerization of an isocyanate compound with an acrylic resin, a dark spot was generated about 400 to 500 hours after the device was left to stand.

Subsequently, for the buffer layers made from the isocyanate compound and the acrylic resin, the sealing effects were compared when the cathode protection layer 55 was provided or not. When the cathode protection layer 55 was not provided, a dark spot was generated about 50 to 100 hours after the device was left to stand. On the other hand, when the cathode protection layer 55 was provided, about 400 to 500 hours had passed until a dark spot was generated.

Moreover, the drying (solidification) in the step of forming the buffer layer 210 was under conditions of an atmospheric pressure and a water vapor partial pressure of about 1200 Pa, about 200 to 300 hours had passed until a dark spot was generated. On the other hand, to remove water or solvent adhering to the substrate or remaining in the material for the buffer layer, the pressure was reduced to about 1000 Pa, and then, nitrogen gas was introduced, so that the water vapor partial pressure was about 0.2 Pa.

When the drying (solidification) was carried out under conditions of an atmospheric pressure and a water vapor partial pressure of about 0.2 Pa, about 400 to 500 hours had passed until a dark spot was generated.

As seen in the above-description, according to the EL display device of this embodiment, a high sealing effect can be obtained. Thus, the service life of the device can be increased.

Moreover, in the above embodiment, the top emission type EL display device 1 was described as an example. The present invention is not restricted to the top emission type EL display device 1, and can be applied to a bottom emission type display device and also a display device of such a type that emitted light is caused to exit from both of the sides.

In the case of a bottom emission type display device or a display device of such a type that emitted light is caused to exit from both of the sides, regarding switching TFTs 112 and driving TFTs 123 formed on the substrate 200, preferably, these TFTs are formed not directly under the light emitting elements but directly under the organic bank layers 221, so that the opening ratio can be increased.

In the EL display device 1, the first electrode according to the present invention functions as an anode, and the second electrode functions as a cathode. Reversely, the first electrode may be caused to function as a cathode, and the second electrode may be caused to function as an anode. In this case, it is necessary to exchange the positions where the light emitting layers 60 and the hole transport layers 70.

According to this embodiment, as an example of the electro-optical device, the EL display device 1 is applied. The present invention is not restricted to the EL display device 1. Basically, the present invention can be applied to any type of electro-optical device, provided that the second electrode is provided on the outer side of the substrate.

Hereinafter, an electronic apparatus according to the present invention will be described. The electronic apparatus contains the above-described EL display device (electro-optical device) 1 as a display unit. Specifically, the electronic apparatuses shown in FIG. 9 are exemplified.

Figure 9A:
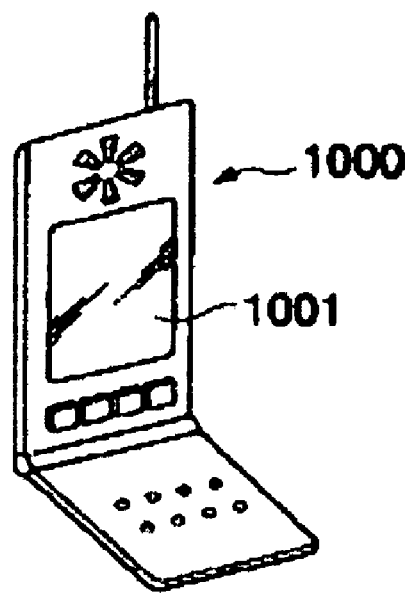
FIG. 9 shows an electronic apparatus.
Figure 9B:
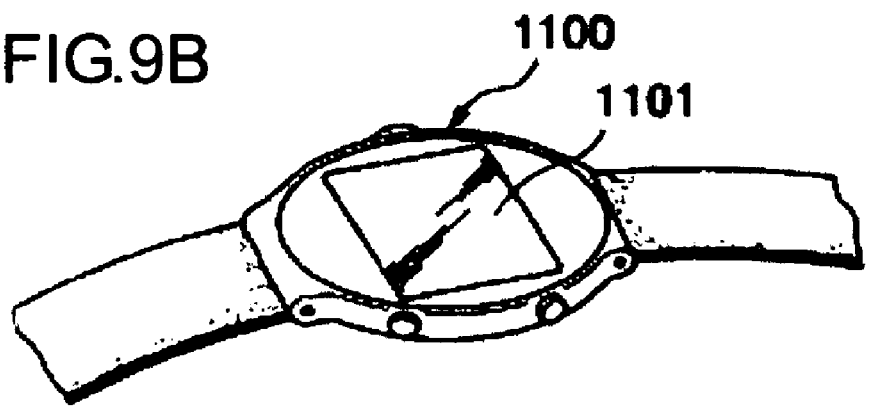
Figure 9C:
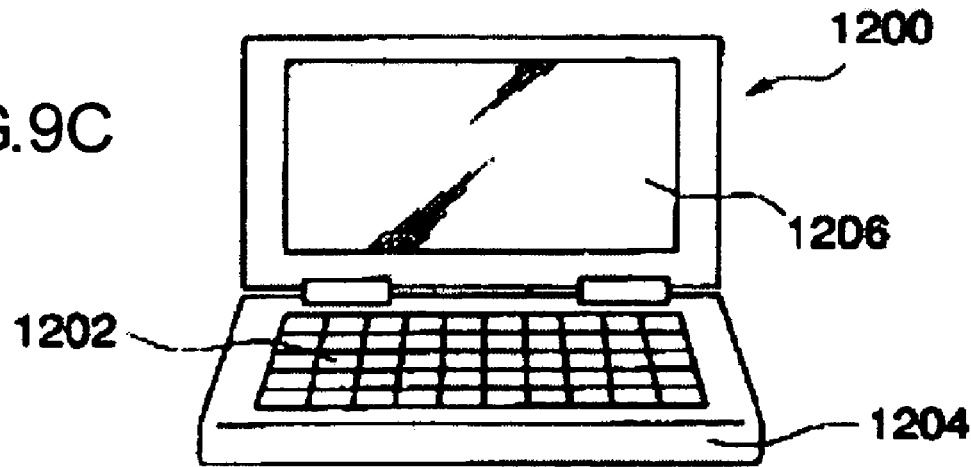

FIG. 9(*a*) is a perspective view of an example of a portable telephone. In FIG. 9(*a*), a portable (telephone 1000 is provided with a display unit 1001 for which the above-described EL display device is used.

FIG. 9(*b*) is a perspective view of an example of a watch type electronic apparatus. In FIG. 9(*b*), a watch 1100 is provided with a display unit 1101 for which the above-described EL display device is used.

FIG. 9(*c*) is a perspective view of a portable information processing apparatus such as a word processor, a personal computer, or the like. The information processing apparatus 1200 is provided with an input unit 1201 such as a key board or the like, a display unit using the above-described EL display device, and an information processing device main piece (casing) 1203.

In the respective electronic apparatuses shown in FIG. 9(*a*) to (*c*) are provided with the display units 1001, 1101, and 1202 containing the above-described EL display devices (electro-optical devices) 1. Accordingly, the service life of the light emitting element of the EL display device constituting the display unit is increased.

What is claimed is:

1. An electro-optical device, comprising:
   a substrate;
   a plurality of first electrodes arranged in a matrix pattern on a pixel electrode region of the substrate;
   a partition having a plurality of openings positioned correspondingly to the plurality of first electrodes;
   electro-optical layers arranged in the respective openings;
   a second electrode covering the partition and the electro-optical layers;
   a resin layer covering the second electrode; and
   a gas-barrier layer covering the resin layer;
   the gas-barrier layer covering the resin layer so that the resin layer is not exposed.

2. The electro-optical device according to claim 1, the resin layer being made of an ultra-violet curable resin.

3. The electro-optical device according to claim 1, further comprising:
   an electrode protection layer formed between the second electrode and the resin layer.

4. The electro-optical device according to claim 3, the electrode protection layer being formed with an ultra-violet absorptive material.

5. The electro-optical device according to claim 1, the resin layer containing fine particles.

6. The electro-optical device according to claim 1, the resin layer covering the resin layer so that the partition is not exposed.

7. The electro-optical device according to claim 1, the gas-barrier layer contacting the electrode protection layer in a region between the pixel electrode region and the periphery of the substrate.

8. An electro-optical apparatus including the electro-optical device specified in claim 1.

* * * * *